United States Patent
Scott et al.

(10) Patent No.: US 6,917,661 B1
(45) Date of Patent: Jul. 12, 2005

(54) METHOD, ARCHITECTURE AND CIRCUITRY FOR CONTROLLING PULSE WIDTH IN A PHASE AND/OR FREQUENCY DETECTOR

(75) Inventors: Paul H. Scott, San Jose, CA (US); S. Babar Raza, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/404,891

(22) Filed: Sep. 24, 1999

(51) Int. Cl.[7] .............................................. H03D 3/24
(52) U.S. Cl. .......................................................... 375/375
(58) Field of Search ................................. 375/375, 372, 375/376, 362, 354, 327, 316, 373, 219, 220, 221

(56) References Cited

U.S. PATENT DOCUMENTS

| | | | | |
|---|---|---|---|---|
| 4,727,541 A | * | 2/1988 | Mori et al. ................... | 370/535 |
| 4,809,345 A | * | 2/1989 | Tabata et al. ................ | 382/300 |
| 6,167,077 A | * | 12/2000 | Ducaroir ...................... | 375/219 |
| 6,201,829 B1 | * | 3/2001 | Schneider .................... | 375/221 |
| 6,377,575 B1 | * | 4/2002 | Mullaney et al. ............ | 370/360 |

* cited by examiner

Primary Examiner—Kevin Burd
(74) Attorney, Agent, or Firm—Christopher P. Maiorana, PC

(57) ABSTRACT

An apparatus comprising a first circuit and a second circuit. The first circuit may be configured to present a parallel output data signal in response to (i) a first clock signal and (ii) one or more serial data signals. The second circuit may be configured to present the one or more serial data signals and the first clock signal in response to (i) a second clock signal and (ii) a parallel input data signal.

19 Claims, 4 Drawing Sheets

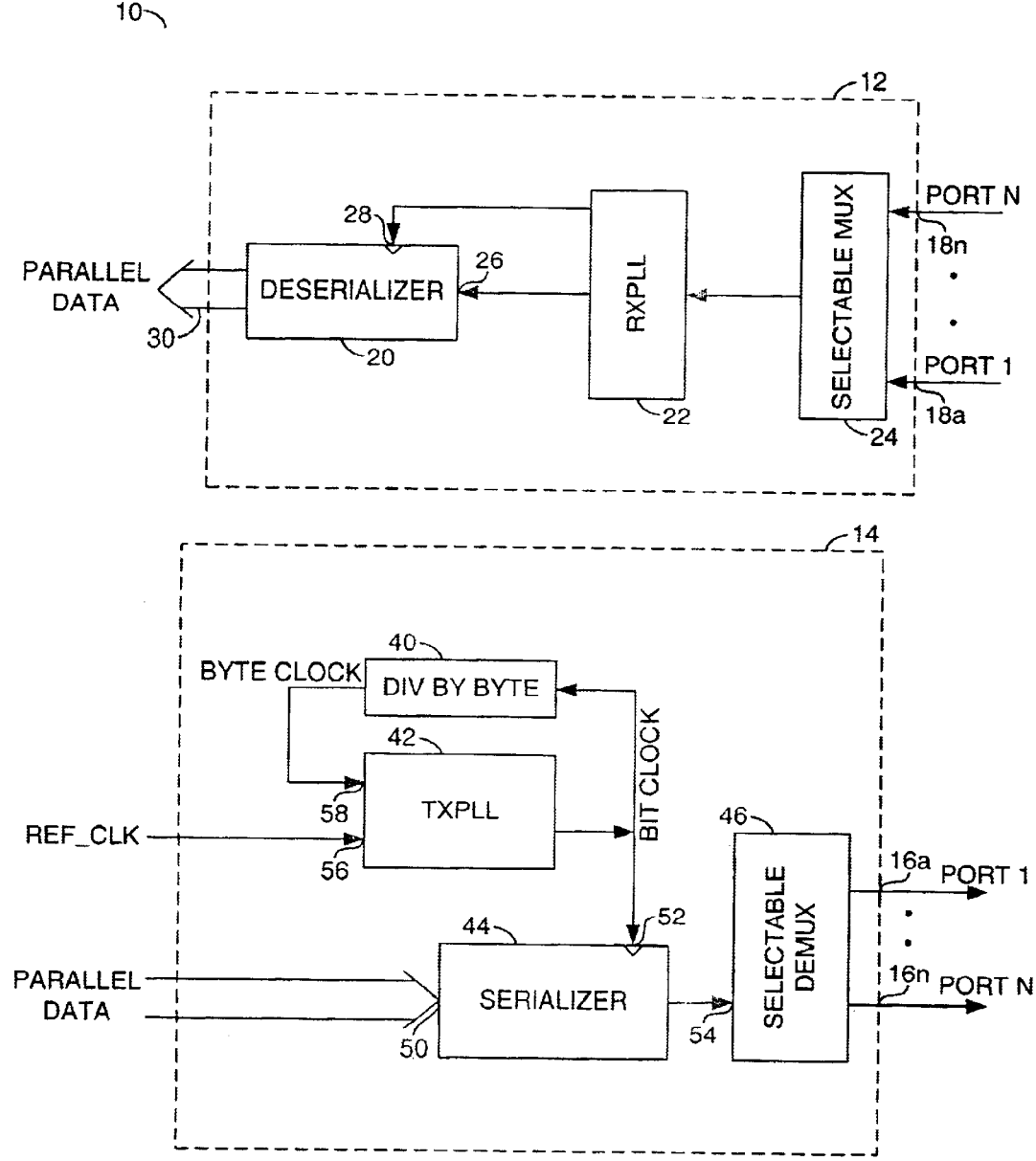
(CONVENTIONAL)
FIG. 1

US 6,917,661 B1

METHOD, ARCHITECTURE AND CIRCUITRY FOR CONTROLLING PULSE WIDTH IN A PHASE AND/OR FREQUENCY DETECTOR

FIELD OF THE INVENTION

The present invention relates to a single frequency serial link system generally and, more particularly, to a method and/or architecture for eliminating a receive PLL in a single frequency serial link system.

BACKGROUND OF THE INVENTION

FIG. 1 shows a block diagram of a circuit 10 illustrating a conventional PLL system. The circuit 10 generally comprises a receive circuit 12 and a transmit circuit 14. The transmit circuit 14 generally comprises a number of outputs 16a–16n that may present information (i.e., serial data) about a number of ports Port1–PortN. The receive circuit 12 may have a number of inputs 18a–18n that may receive the information from the transmitter circuit 14. The receive circuit 12 generally comprises a deserializer circuit 20, a receive PLL 22 and a selectable multiplexer 24. The selectable multiplexer 24 presents a signal to the receive PLL in response to the information received at the inputs 18a–18n. The receive PLL presents a first signal to an input 26 of the deserializer 20 and a second signal to an input 28 of the deserializer 20. The deserializer 20 may present a parallel data word at an output 30 in response to the signals received at the inputs 26 and 28.

The transmitter circuit 14 generally comprises a divide circuit 40, a transmit PLL 42, a serializer circuit 44 and a selectable demultiplexer 46. The serializer 44 generally receives a parallel data word at an input 50 and a signal BIT_CLOCK at an input 52. The serializer 44 generally presents a signal to an input 54 in response to the parallel data received at the input 50 and the bit clock received at the input 52. The transmit PLL 42 generally presents the signal BIT_CLOCK in response to a reference clock signal REF-CLK received at an input 56 and a signal BYTE_CLOCK received at an input 58. The divide circuit 40 generally converts the signal BIT_CLOCK to the signal BYTE_CLOCK. Data is received by the transmitter circuit 14 on a parallel bus and is serialized using the signal BIT_CLOCK. Once the data is serialized, the data is sent through the selectable demultiplexer 46 to one of the ports Port1–PortN.

For the receive side, the data received by one of the ports Port1–PortN of the receive circuit 12. The data is passed through the selectable multiplexer 24 to the receive PLL 22. The receive PLL 22 recovers a clock signal from the incoming serial data, and presents the serial data and the recovered clock to the inputs 26 and 28 of the deserializer circuit 20. The deserializer circuit 20 presents the parallel data at the output 30. The circuit 10 has two PLLs (i.e., the receive PLL 22 and the transmit PLL 42) one for the receive circuit 12 and one for the transmit circuit 14.

SUMMARY OF THE INVENTION

The present invention concerns an apparatus comprising a first circuit and a second circuit. The first circuit may be configured to present a parallel output data signal in response to (i) a first clock signal and (ii) one or more serial data signals. The second circuit may be configured to present the one or more serial data signals and the first clock signal in response to (i) a second clock signal and (ii) a parallel input data signal.

The objects, features and advantages of the present invention include providing a serial communication link that may (i) eliminate lock time and/or (ii) be implemented using a single PLL.

BRIEF DESCRIPTION OF THE DRAWINGS

These and other objects, features and advantages of the present invention will be apparent from the following detailed description and the appended claims and drawings in which:

FIG. 1 is a diagram of a conventional circuit for single frequency serial link system;

DETAILED DESCRIPTION OF THE PREFERRED EMBODIMENTS

Figure 2:
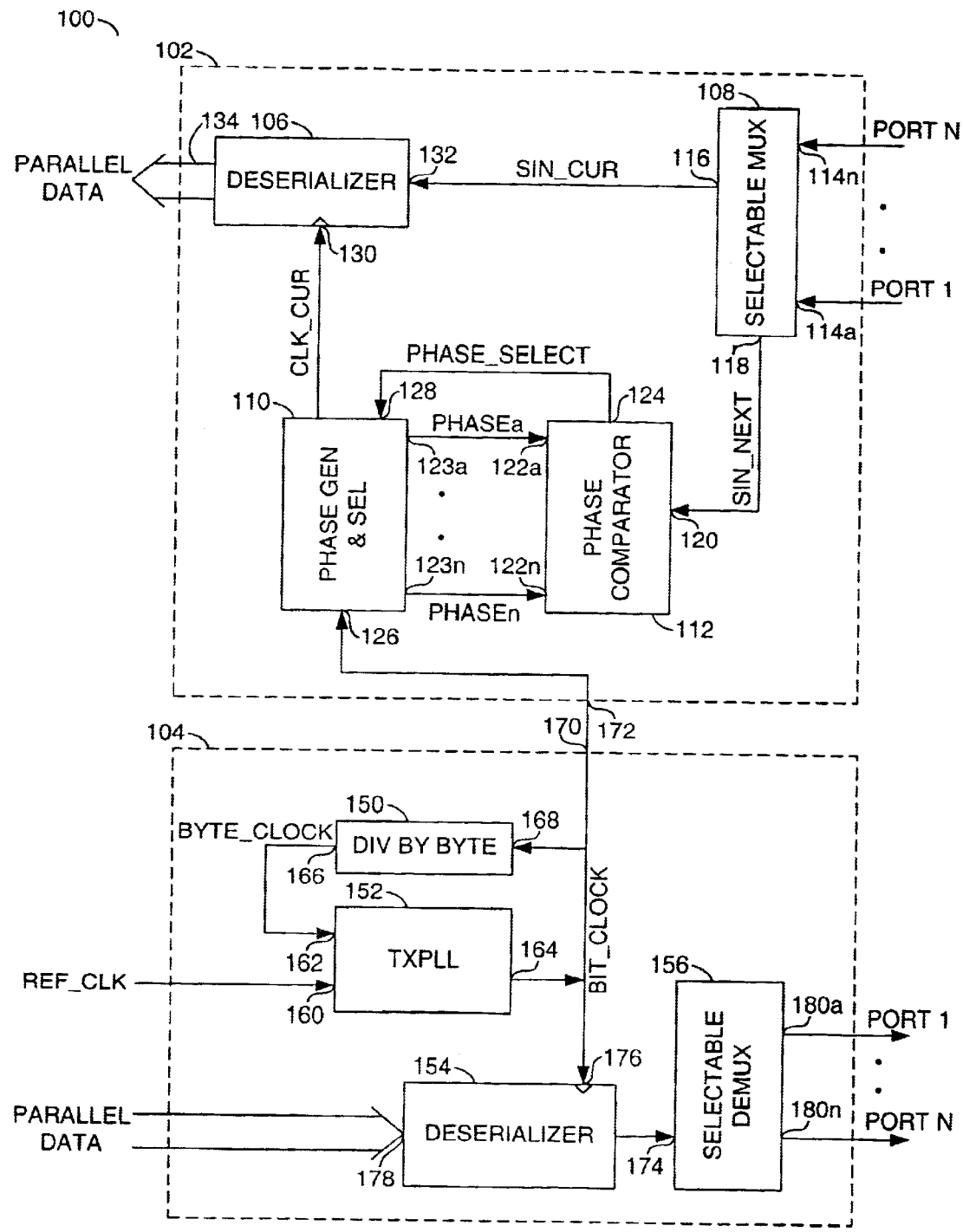
FIG. 2 is a block diagram of a preferred embodiment of the present invention.

Referring to FIG. 2, a block diagram of a circuit 100 is shown in accordance with a preferred embodiment of the present invention. The circuit 100 generally comprises a receive block (or circuit) 102 and a transmit block (or circuit) 104. The receive block 102 generally comprises a deserializer circuit 106, a selectable multiplexer 108, a phase generation and selection block (or circuit) 110 and a phase comparator block (or circuit) 112. The selectable multiplexer circuit 108 may have a number of inputs 114a–114n that may receive information (e.g., serial data) from a number of ports (e.g., Port1–PortN). The selectable multiplexer circuit 108 may present a signal (e.g., SIN_CUR) at an output 116 and a signal (e.g., SIN_NEXT) at an output 118. The signals SIN_CUR and SIN_NEXT may be serial data from the current port PORTa–PORTn and the next port PORTa–PORTn.

The phase comparator circuit 112 may have an input 120 that may receive the signal SIN_NEXT and a number of inputs 122a–122n that may receive a number of signals (e.g., phase signals PHASEa–PHASEn) from the phase generator and select circuit 110. The phase comparator 112 may have an output 124 that may present a signal (e.g., PHASE_SELECT) in response to the signals PHASEa–PHASEn and the signal SIN_NEXT. The phase generation and select circuit 110 may have an input 126 that may receive a signal (e.g., BIT_CLOCK) from the transmitter circuit 104 and an input 128 that may receive the signal PHASE_SELECT. The phase generation and select circuit 110 may present a signal (e.g., CLK_CUR) to an input 130 of the deserializer circuit 106 in response to the signal PHASE_SELECT and the signal BIT_CLOCK. The deserializer circuit 106 may have an input 132 that may receive the signal SIN_CUR. The deserializer circuit 106 may present parallel data at an output 134 in response to the signal CLK_CUR and the signal SIN_CUR.

The transmit circuit 104 generally comprises a divide circuit 150, a transmit PLL circuit 152, a deserializer circuit 154 and a selectable demultiplexer circuit 156. The transmit PLL circuit 152 may receive a reference clock signal (e.g., REF_CLK) at an input 160 and a clock signal (e.g., BYTE_CLOCK) at an input 162. The transmit PLL circuit 152 may present a clock signal (e.g., BIT_CLOCK) at an output 164 in response to the reference clock signal REF_CLK and the signal BYTE_CLOCK. The divide circuit 150 may present the signal BYTE_CLOCK at an output 166 in response to the signal BIT_CLOCK received at an input 168. The signal BIT_CLOCK may also be presented, through an output 170, to an input 172 of the receive circuit 102. The deserializer circuit 154 may present a signal to an input 174 of the selectable demultiplexer circuit 156 in response to the signal BIT_CLOCK received at an input 176 and the parallel data received at an input 178. The selectable demultiplexer circuit 156 may present serial data at a number of outputs 180a–180n.

The selectable multiplexer circuit 108 may be configured to send data on two ports, one to data destination port (e.g., the output 116) and the other to the look-ahead port (e.g., the output 118). The look-ahead output 118 may communicate data in the next slot time. Since the circuit 100 is generally implemented in a single frequency serial link system, the same reference clock REF_CLK may be used by all the ports Port1–PortN.

In the receiver circuit 102, the receive PLL (of FIG. 1) is eliminated and is generally replaced by the phase generator and select circuit 110 and the phase comparator circuit 112. The selectable multiplexer 108 may select two of the N ports Port1–PortN and (i) pass the current serial data as the signal SIN_CUR and (ii) pass serial data for the next slot time as the signal SIN_NEXT. The signal SIN_CUR may be the data that is currently being received by the selectable multiplexer 108. The signal SIN_NEXT may be the look-ahead data used by the phase comparator circuit 112 to pick the phase for a slot time after an end of packet is encountered.

The phase comparator circuit 112 may generate the signal PHASE_SELECT in response to a comparison of the signal SIN_NEXT to the different phase signals PHASEa–PHASEn received from the phase generator and select circuit 110. The phase generator and select circuit 110 may generate a number of phases of the signal BIT_CLOCK as the clock phase signals PHASEa–PHASEn. The clock phase signals PHASEa–PHASEn may be presented to the inputs 122a–122n of the phase comparator circuit 112. The phase comparator circuit 112 may determine the particular clock phase signal PHASEa–PHASEn that may correspond to the particular serial data received at the inputs 114a–114n.

Figure 3:
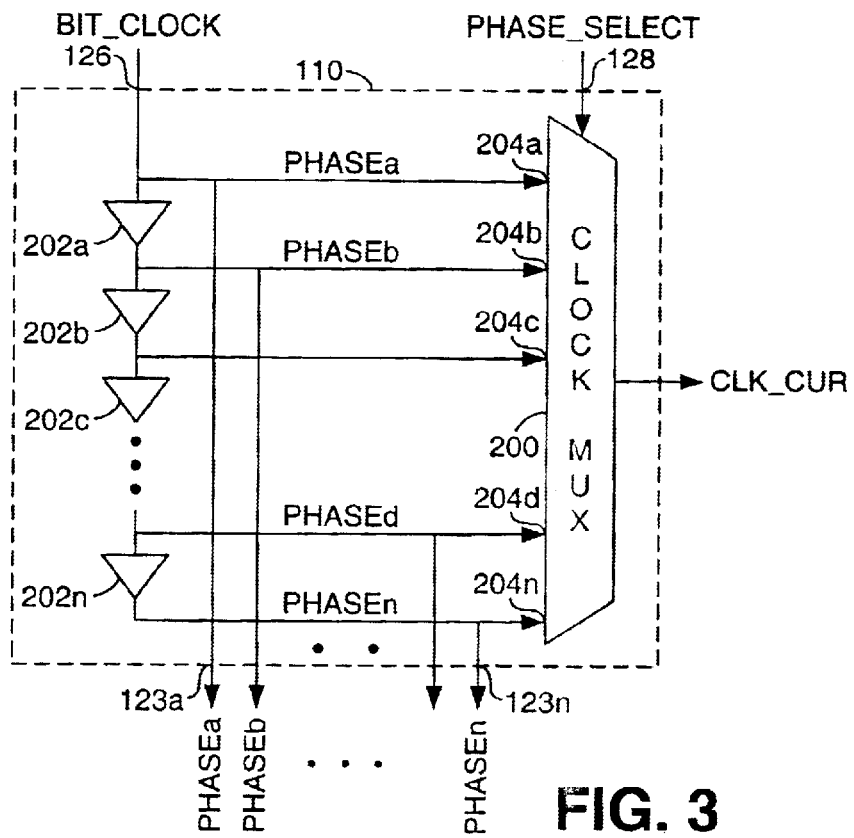
FIG. 3 is a circuit diagram of a phase generation and select clock circuit of FIG. 2.

Referring to FIG. 3, a circuit diagram of the phase generation and select circuit 110 is shown. The phase generation and select circuit 110 may comprise a clock multiplexer 200 and a number of buffers 202a–202n. The buffers 202a–202n may each be connected in series with the signal BIT_CLOCK. A respective output of each of the buffer circuits 202a–202n may be presented to one of a number of inputs 204a–204n of the multiplexer 200. For example, the input 204a may receive the signal BIT_CLOCK prior to any of the buffer circuits 202a–202n. The input 204b may receive the output of the buffer circuit 202a. The input 204n may receive the output of the buffer circuit 202n. The outputs of the buffers 202a–202n may be the phase signals PHASEa–PHASEn, respectively. Additionally, the phase signals PHASEa–PHASEn presented to the inputs 204a–204n may also be presented to the outputs 123a–123n. For example, the signal presented to the input 204a may also be presented to the output 123a. The multiplexer 200 may be configured to present the signal CLK_CUR in response to the phase signals PHASEa–PHASEn and the signal PHASE_SELECT.

The signal BIT_CLOCK may pass through different delay elements 202a–202n to generate different phases of the signal BIT_CLOCK. The phase comparator circuit 112 may select the phase that may correspond to the current serial data in response to the signal PHASE_SELECT received at the input 128.

Figure 4:
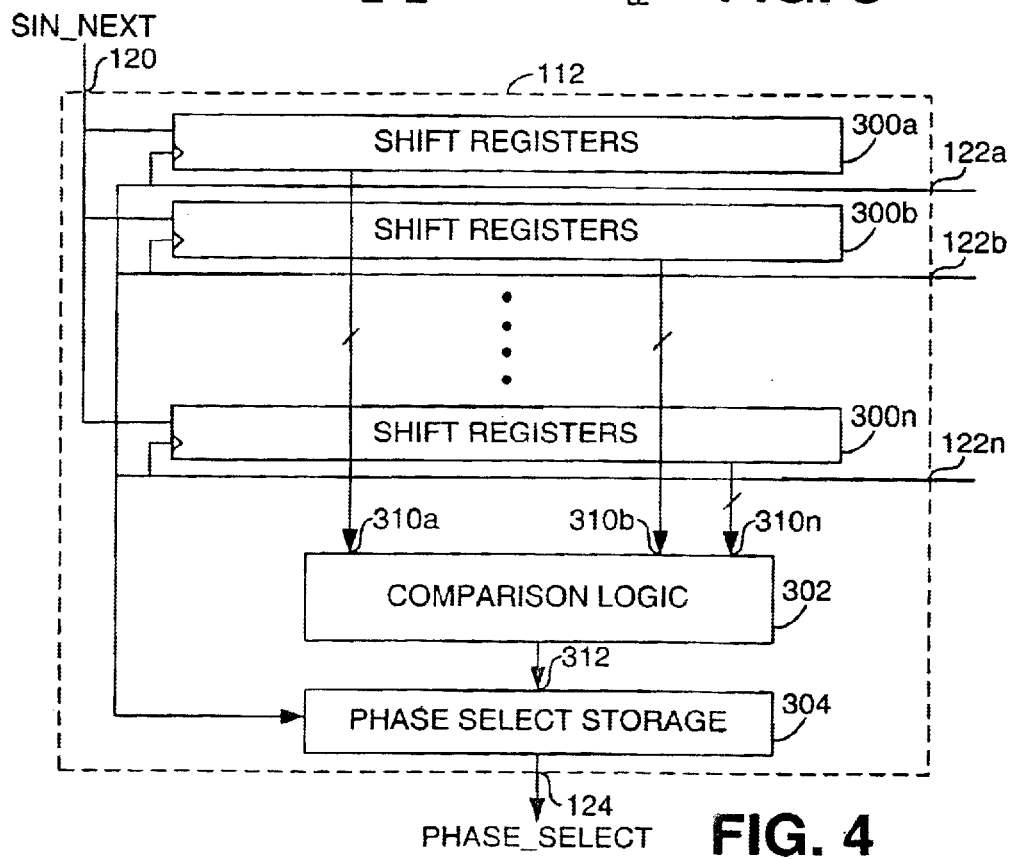
FIG. 4 is a detailed block diagram of a phase comparator circuit of FIG. 2.

Referring to FIG. 4, a detailed block diagram of the phase comparator circuit 112 is shown. The phase comparator circuit 112 generally comprises a number of shift register blocks (or circuits) 300a–300n, a comparison logic circuit 302 and a phase select storage circuit 304. Each of the shift register blocks 300a–300n may receive the signal SIN_NEXT from the input 120 and one of the signals PHASEa–PHASEn from the inputs 122a–122n. Each of the shift register blocks 300a–300n may present a multi-bit signal to an input 310a–310n of the comparison logic block 302. The comparison logic block 302 may present a signal to an input 312 of the phase select storage block 304. The phase select storage block 304 may present the signal PHASE_SELECT in response to the signal received at the signal 312 and one or more of the clock phase signals PHASEa–PHASEn received at an input 314.

The signal SIN_NEXT is generally presented to each of the shift register blocks 300a–300n, which are generally clocked with different clock phase signals PHASEa–PHASEn. The data from each of the shift register blocks 300a–300n may be compared with a known expected value. The shift register blocks 300a–300n with the best match to one or more known values generally determines the phase of the incoming serial link Port1–PortN. The selected value is loaded into the phase select storage device 304 in the next slot time after the end of packet is encountered.

Figure 5:
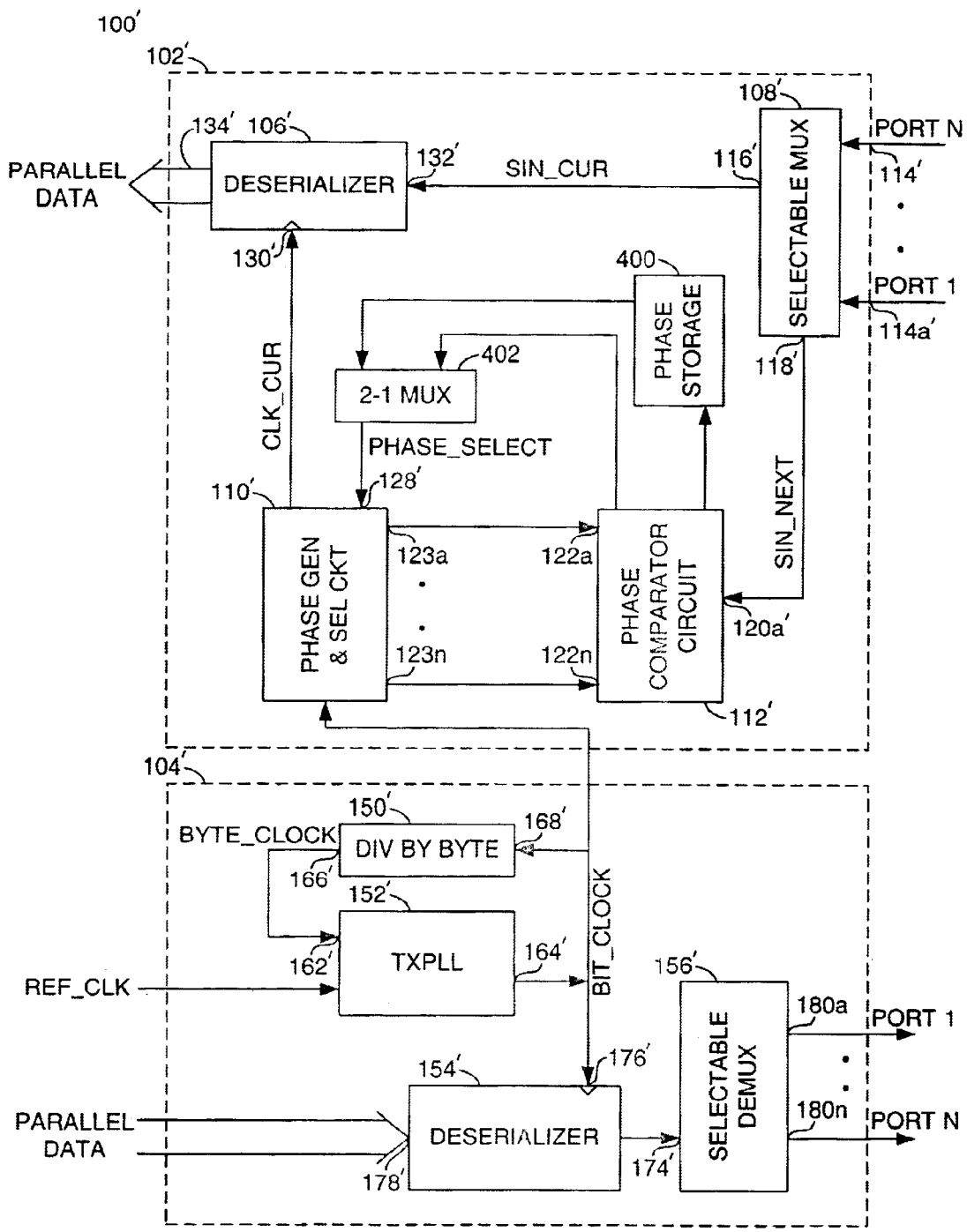
FIG. 5 is a block diagram of an alternate embodiment of the present invention.

Referring to FIG. 5, a circuit 100' illustrating an alternate embodiment of the present invention is shown. The circuit 100' further comprises a phase storage device 400 and a multiplexer 402. The circuit 100' may store the output of the phase comparator 112' in the phase storage device 400 during an initialization of each port Port1–PortN. The value of the selected phase can then be passed to the phase generator and select circuit 110' from the phase storage device 400, through the multiplexer 402, rather than continually calculating and generating the signal PHASE_SELECT. When not calculating the signal PHASE_SELECT, the phase comparator circuit 112' may be powered down. If any of the ports change phase, the particular port or the circuit 100' may be reinitialized.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to present a parallel output data signal in response to (i) a selected phase of a plurality of phases of a first multi-phased clock signal and (ii) two or more serial data signals; and
   a second circuit configured to present said two or more serial data signals and said first clock signal in response to (i) a second clock signal and (ii) a parallel input data signal.

2. The apparatus according to claim 1, wherein said first multi-phased clock signal comprises a bit clock signal.

3. The apparatus according to claim 1, wherein said second clock signal comprises a reference clock signal.

4. The apparatus according to claim 1, wherein said selected phase of said multi-phased first clock signal is selected in response to a phase selection circuit.

5. The apparatus according to claim 1, wherein:
a phase generation circuit is configured to generate said plurality of phases of said first clock signal.

6. The apparatus according to claim 1, wherein said first circuit further comprises:
a third circuit configured to generate (i) one or more select signals and (ii) a selected clock signal in response to (i) said first multi-phased clock signal and (ii) a phase select signal.

7. The apparatus according to claim 6, wherein said third circuit comprises a phase generation and select circuit.

8. The apparatus according to claim 6, wherein said first circuit further comprises:
a phase comparator circuit configured to generate said phase select signal in response to said one or more select signals and a first of said two or more serial data signals.

9. The apparatus according to claim 8, wherein said first circuit includes a deserializer circuit configured to generate said parallel output data signal in response to said selected clock signal and a second of said two or more serial data signals.

10. The apparatus according to claim 9, wherein said first circuit further comprises:
a multiplexer configured to generate (i) said first of said two or more serial data signals and (ii) said second of said two or more serial data signals, in response to said two or more serial data signals.

11. A circuit comprising:
means for generating a parallel output data signal in response to (i) a selected phase a plurality of phases of a multi-phased first clock signal and (ii) two or more serial data signals; and
means for generating said two or more serial data signals and said multi-phased first clock signal in response to (i) a second clock signal and (ii) a parallel input data signal.

12. A method for controlling a pulse width in a phase and/or frequency detector comprising the steps of:
(A) generating a parallel output data signal in response to (i) a selected phase of a plurality of phases of a multi-phased first clock signal and (ii) two or more serial data signals; and
(B) generating said two or more serial data signals and said first clock signal in response to (i) a second clock signal and (ii) a parallel input data signal, wherein said multi-phased first clock signal is configured to control said pulse width.

13. The method according to claim 12, wherein said multi-phased first clock signal comprises a bit clock signal.

14. The method according to claim 12, wherein said second clock signal comprises a reference clock signal.

15. The method according to claim 12, wherein step (A) further comprises the sub-step of:
generating (i) one or more select signals and (ii) a selected clock signal in response to (i) said first clock signal and (ii) a phase select signal.

16. The method according to claim 15, wherein step (A) further comprises the sub-step of:
generating said phase select signal in response to said one or more select signals and a first of said two or more serial data signals.

17. The method according to claim 16, wherein step (A) further comprises the sub-step of:
generating said parallel output data signal in response to said selected clock signal and a second of said two or more serial data signals.

18. The method according to claim 17, further comprising the step of:
generating said first of said two or more serial data signals and said second of said two or more serial data signals, in response to said two or more serial data signals.

19. An apparatus comprising:
a first circuit configured to present a parallel output data signal in response to (i) a selected phase of a first clock signal and (ii) two or more serial data signals;
a second circuit configured to present said two or more serial data signals and said first clock signal in response to (i) a second clock signal and (ii) a parallel input data signal; and
a third circuit configured to generate (i) one or more select signals and (ii) a selected clock signal in response to (i) said first clock signal and (ii) a phase select signal.

* * * * *